US006370360B1

(12) United States Patent
Künkel (10) Patent No.: US 6,370,360 B1
(45) Date of Patent: Apr. 9, 2002

(54) ARRANGEMENT AND METHOD FOR RADIO COMMUNICATION

(75) Inventor: Lars Peter Künkel, Landskrona (SE)

(73) Assignee: Telefonaktiebolaget LM Ericsson (SE)

( * ) Notice: Subject to any disclaimer, the term of this patent is extended or adjusted under 35 U.S.C. 154(b) by 0 days.

(21) Appl. No.: 09/150,163

(22) Filed: Sep. 9, 1998

(30) Foreign Application Priority Data

Sep. 11, 1997 (SE) .............................................. 9703294

(51) Int. Cl.[7] ............................................... H04B 1/40
(52) U.S. Cl. ....................... 455/76; 455/77; 455/183.1; 455/260; 455/552
(58) Field of Search .............................. 455/76, 77, 75, 455/84, 86, 87, 85, 165.1, 183.1, 255, 256, 314, 318, 257–260, 74, 552, 553; 331/25

(56) References Cited

U.S. PATENT DOCUMENTS

| 4,969,210 A |   | 11/1990 | Hansen et al. ............... 455/188 |
|---|---|---|---|
| 5,021,754 A |   | 6/1991 | Shepherd et al. ........... 332/128 |
| 5,055,800 A |   | 10/1991 | Black et al. ................. 331/1 A |
| 5,065,408 A |   | 11/1991 | Gillig ............................. 375/8 |
| 5,111,162 A |   | 5/1992 | Hietala et al. ............... 332/127 |
| 5,448,763 A | * | 9/1995 | Gillig ........................... 455/76 |
| 5,493,700 A |   | 2/1996 | Hietala et al. ................ 455/75 |
| 5,535,432 A | * | 7/1996 | Dent ............................ 455/77 |
| 5,727,019 A | * | 3/1998 | Tatsumi ........................ 455/76 |
| 5,890,051 A | * | 3/1999 | Schlang et al. ............... 455/76 |
| 5,974,305 A | * | 10/1999 | Matero ......................... 455/86 |

FOREIGN PATENT DOCUMENTS

| EP | 0 727 877 A3 | 8/1996 | .......... H03L/7/197 |
|---|---|---|---|
| GB | 2091960 A | 8/1982 | |
| WO | WO 96/08883 | 3/1996 | |
| WO | PCT/SE98/01413 | 11/1998 | |

OTHER PUBLICATIONS

Magnusson, G.; *PCT International–Type Search Report*, Search Request No. SE97/01096; Jul. 23, 1998; pp. 1–4.

* cited by examiner

Primary Examiner—Lester G. Kincaid
(74) Attorney, Agent, or Firm—Jenkens & Gilchrist (57) ABSTRACT

The present invention relates to a radio communication unit (20) comprising radio communication means (23, 25, 27) for communication (reception and/or transmission) in one or more frequency ranges with associated channel spacings. The radio communication means use oscillator signals for channel selection in the frequency ranges. The radio communication unit further comprises a system clock (77) generating a clock signal having a predetermined frequency that is not divisible by all the channel spacings. According to the invention the oscillator signals used in the channel selection are generated by a frequency synthesizer circuit (29) in the form of a fractional-N PLL circuit, said clock signal being fed as a reference frequency signal to the fractional-N PLL circuit. The invention also comprises a radio telephone comprising such a radio communication unit and the use of such a radio communication unit.

23 Claims, 3 Drawing Sheets

ARRANGEMENT AND METHOD FOR RADIO COMMUNICATION

TECHNICAL FIELD

The present invention relates to the technical field of arrangements and methods for radio communication in frequency ranges divided into channels, and more specifically to the part of this field concerning channel selection in the frequency ranges.

BACKGROUND

The radio frequency spectrum is divided into frequency ranges utilized for different applications, for example, sound radio, television, mobile telephony, satellite communication, radar, and air and sea radio. Often these frequency ranges are in turn divided into a number of channels on which independent information may be transmitted. The frequency spacing between the channels in a frequency range is normally referred to as channel spacing, or carrier separation. A number of the frequency ranges used for mobile telephony are divided into channels in this way, for example, the mobile telephony systems Advanced Mobile Phone Service (AMPS), Global System for Mobile Communication (GSM) and Personal Communications System 1900 (PCS 1900). The channel spacing may, however, differ between the systems.

The same frequency range is sometimes used for different applications, and the channel spacing may differ for different applications. Usually, however, the same frequency range cannot be used for different applications at the same time in the same geographical area, since the signals associated with the different applications would disturb each other.

In radio communication in a frequency range divided into a number of channels it must be possible to select, with high precision, the channel that is to be used for reception or transmission at a given time. An early type of receiver (from the 1920s) was the so called straight receiver. In the straight receiver the channel selection is made using bandpass filters having variable centre frequencies. It is, however, hard to design variable bandpass filters having a good selectivity, since the centre frequency is varied over a larger frequency range. Today, therefore, the channel selection at reception is made in another way. One way is to use filters having fixed frequency characteristics and good selectivity and frequency displace the received radio frequency signals instead, using oscillator signals, the frequency of which has been selected with respect to the channel to be selected and the frequency characteristics of the filters. For example, the channel selection in a superheterodyne receiver or a homodyne receiver is based on these principles. Oscillator signals can also be used for channel selection at transmission, for example when mixing a modulated baseband or intermediate frequency signal to the desired channel in the radio frequency range.

When selecting channels for reception and/or transmission in a certain frequency range, there is therefore a need to be able to generate oscillator signals for which the mutual frequency difference between the oscillator signals corresponds to the channel spacing in the frequency range. Frequency synthesizing circuits for this purpose have, of course, been developed. One type of frequency synthesizing circuit is called a phase locked loop (PLL). With a conventional type phase locked loop oscillator signals having a frequency according to $N/R f_{ref}$, N and R being arbitrary integers, may be generated using a reference frequency. To be able to generate oscillator signals for channel selection in a frequency range with a certain channel spacing using such a phase locked loop the reference frequency should be divisible by the channel spacing, if a low noise level and a good loop bandwidth are to be achieved. If the available frequency, which is to be used as a reference frequency is not divisible by the channel spacing, it may be multiplied, using a frequency multiplier, by a suitable integer K. A disadvantage of this solution is that the frequency multiplier requires space and power. Another disadvantage is that there is a risk that the reference frequency obtained from the frequency multiplier is too high to be feasible for use in circuits currently available. This risk is particularly high if there is a need to generate oscillator signals for channel selection in several frequency ranges with different channel spacing.

Another type of frequency synthesizing circuit is a so called fractional-N PLL. From a reference frequency fref, using a fractional-N PLL circuit, it is possible to generate oscillator signals, having frequencies according to $$\frac{N + F/Q}{R} f_{ref},$$

N, F, Q and R being freely selectable integers. Fractional-N PLL circuits are usually used to achieve a faster adjustment of the frequency of the oscillator signals, which is an advantage for applications using frequency hopping. One example of a design of a fractional-N PLL circuit is given in the Patent Specification GB, A, 2091960.

Patent Specification WO, A1, 96/08883 describes how a fractional-N PLL is used in a dual-mode radio telephone. It is to be possible to use the radio telephone both in GSM (with a channel spacing of 200 kHz) and in satellite communication (with a channel spacing of 5 kHz). The intention is to be able to generate oscillator signals for channel selection with large channel spacing (GSM) and short channel spacing (satellite) in an efficient way. The document shows a frequency synthesizing circuit utilizing combinations of fractional-N PLL and so called Vernier loop techniques. (In Vernier loop techniques two phase locked loops are used having slightly different comparator frequencies, which enables the generations of oscillator signals for channel selection for channel spacings corresponding to the difference frequencies between the comparator frequencies) to obtain frequencies for both the communication systems. The design may also be used in a situation in which the available reference frequency is not divisible by all the channel spacings. This design, however, has disadvantages. The design is relatively complicated, requires a lot of space and relatively high currents and power.

SUMMARY OF THE INVENTION

The present invention relates to a radio communication unit comprising radio communication means for communication (reception and/or transmission) in one or more frequency ranges with associated channel spacing. The radio communication means utilize oscillator signals for channel selection in the frequency ranges. The radio communication unit further comprises a system clock generating a clock signal of a predetermined frequency not divisible by all the channel spacings. A first problem attacked by the invention is to obtain, in such a radio communication unit, a frequency synthesizer circuit that may be used for generating the oscillator signals utilized by the radio communication means for channel selection in all the frequency ranges. Another problem attacked by the invention is that the frequency synthesizing circuit is to be small and consume little power and current.

The problems stated above are solved, in general, in that the radio communication unit comprises a frequency synthesizing circuit in the form of a fractional-N PLL circuit, the fractional-N PLL circuit being arranged to utilize the clock signal as a reference frequency signal.

The purpose of the invention is thus to utilize the possibility of frequency division by rational number offered by a fractional-N PLL circuit, to enable the utilization of the available clock signal as a reference frequency signal even though the frequency of the clock signal is not divisible by all the channel spacings. The invention also comprises the use of such a radio communication unit and a radio telephone comprising such a radio communication unit.

The problems stated above are solved more specifically by a fractional-N PLL circuit having one or more controllable oscillators. The controllable oscillators are connected to the radio communication means and the oscillator signals generated by the controllable oscillators are used for channel selection in the radio communication means. The fractional-N PLL circuit controls the controllable oscillators so that osillator signals of frequencies corresponding to the frequency of the clock signal multiplied by a factor (N+F/Q)/R are generated, N, F, Q being integers selected according to the invention with respect to the frequency of the clock signal, the channel spacing and the design of the radio communication means, so that the desired channel is selected.

The invention has the advantage, in addition to solving the above stated problem, that the fractional-N PLL circuit can utilize comparator frequencies higher than the channel spacing, which causes less noise and faster settling in the generation of the oscillator signals.

The invention will now be described in more detail by means of preferred embodiments and with reference to the appended drawings.

DESCRIPTION OF PREFERRED EMBODIMENTS

Figure 1:
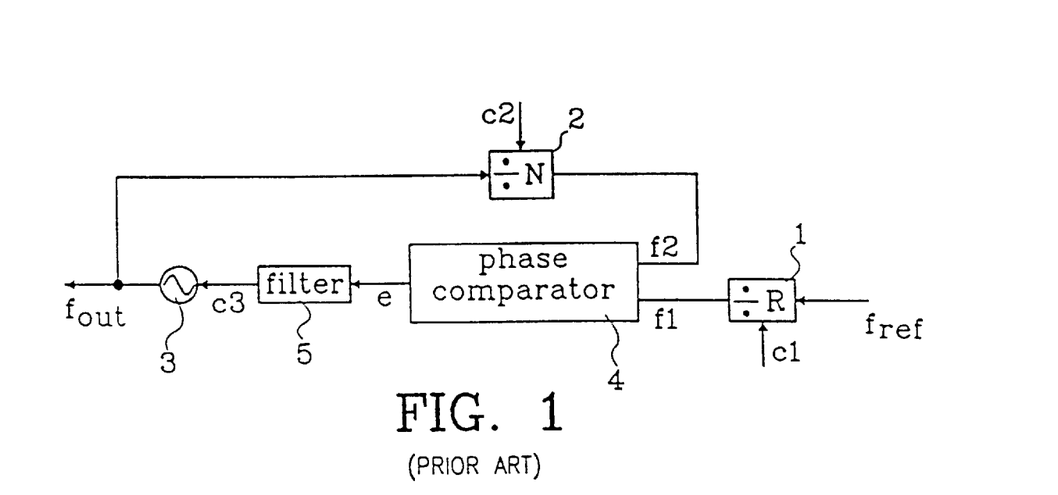
FIG. 1 is a block diagram of a phase-locked loop.

FIG. 1 shows a block diagram of a type of frequency synthesizing circuit well known in the art, more specifically a phase locked loop, generally referred to by the acronym PLL. The phase locked loop shown in FIG. 1 comprises a reference frequency divider 1 and a main frequency divider 2. The reference frequency divider 1 is arranged to receive a reference frequency signal having a reference frequency of $f_{ref}$. The reference frequency divider 1 is also arranged to generate a first frequency divided signal from the reference frequency signal, by means of a frequency division corresponding to an integer R, said frequency divided signal having a first frequency f1 ($f1=f_{ref}/R$). The first frequency f1 is sometimes referred to as the comparator frequency. The reference frequency divider 1 is arranged to receive a first control signal c1 determining the value of the integer R. The main frequency divider 2 is connected to a controllable oscillator 3 and is arranged to received an oscillator signal generated by the controllable oscillator and having an output frequency of $f_{out}$. The main frequency divider 2 is arranged to generate a second frequency divided signal from the oscillator signal by a frequency division corresponding to an integer N, said second frequency divided signal having a second frequency of f2 ($f2=f_{out}/N$). The main frequency divider 2 is also arranged to receive a second control signal c2 determining the value of the integer N.

The phase locked loop shown in FIG. 1 comprises a phase comparator 4 connected to the reference frequency divider 1 and the main frequency divider 2. The phase comparator 4 is arranged to receive the first and the second frequency divided signal. The phase comparator 4 is arranged to generate a phase difference signal e corresponding to a phase difference between the first and the second frequency divided signal.

The phase locked loop shown in FIG. 1 comprises means for generating a third control signal c3 in dependence of the phase difference signal e, for controlling the controllable oscillator 3. The phase locked loop thus comprises a loop filter 5 connected to the phase comparator 4 for receiving the phase difference signal e. The loop filter 5 is arranged to generate the third control signal c3 by filtering the phase difference signal e. The controllable oscillator 3 is connected to the loop filter 5 for receiving the third control signal c3. The loop filter 5 is arranged to generate the third control signal c3 in such a way that the phase difference between the first and the second frequency divided signal is eliminated. This implies that the first and the second frequencies f1 and f2 in the following will be equal, which in turn implies that the output frequency $f_{out}$ in the following will be given by:

$$f_{out} = \frac{N}{R} f_{ref}. \qquad (1)$$

Figure 2:
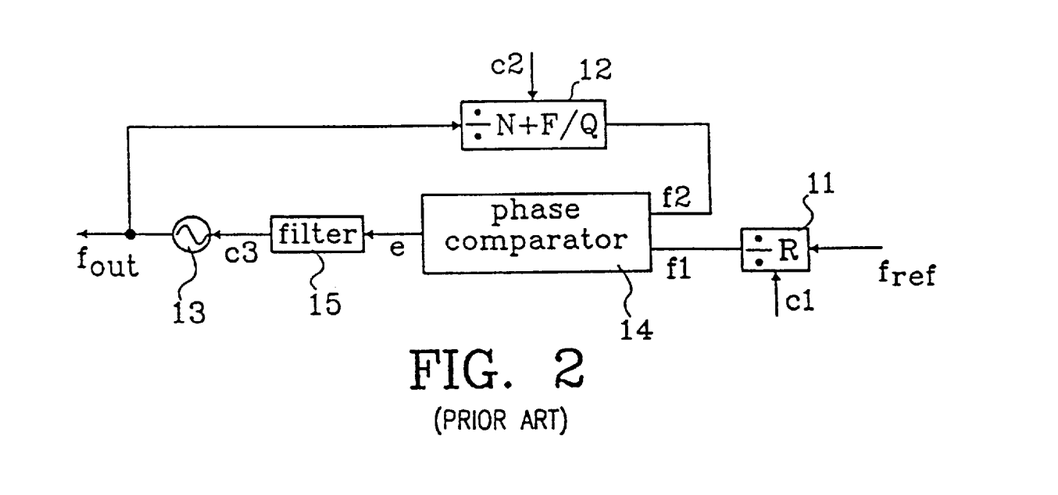
FIG. 2 is a block diagram of a fractional-N PLL circuit.

FIG. 2 shows a block diagram of another type of frequency synthesizing circuit well known in the art, more specifically a so called fractional-N PLL. The block diagram shown in FIG. 2 has significant similarities with the block diagram shown in FIG. 1. Thus, the block diagram shown in FIG. 2 comprises: a reference frequency divider 11, a main frequency divider 12, a controllable oscillator 13, a phase comparator 14 and a loop filter 15. The reference frequency divider 11 is arranged to receive a first control signal c1 and the main frequency divider 12 is arranged to receive a second control signal c2. The loop filter 15 is arranged to generate a third control signal c3 for controlling the controllable oscillator 13, in a corresponding way as the loop filter 5 shown in FIG. 1. The only formal difference between the block diagram of FIG. 1 and the block diagram of FIG. 2 is that the main frequency divider 12 in FIG. 2 is arranged to carry out a frequency division corresponding to a rational number N+F/Q, N, F and Q being integers, the values of which are determined by the second control signal c2 in FIG. 2. Using the frequency synthesizer circuit shown in FIG. 2, therefore, the output frequency $f_{out}$ in the following will be given by $$f_{out} = \frac{N + F/Q}{R} f_{ref}. \qquad (2)$$

A phase locked loop, like the phase locked loop shown in FIG. 1, is usually used in radio applications for generating oscillator signals used for channel selection at reception and/or transmission in radio communication units. In order to select channels in a frequency range with a certain channel spacing CS, it must be possible to generate a sequence of oscillator signals having a mutual frequency difference corresponding to the channel spacing CS. When generating the oscillator signals using the phase-locked loop of FIG. 1 the same comparator frequency should be used, since the comparator frequency must be taken into account when designing the loop filter 5. Also, to achieve a low noise level and a favourable loop bandwidth, the comparator frequency should not be lower than the channel spacing CS. Considering these conditions and Equation (1) it can be seen that the reference frequency $f_{ref}$ must be divisible by the channel spacing CS to make it possible to use the phase locked loop shown in FIG. 1.

When generating the reference frequency signal, normally, a reference oscillator is used. Often the frequency of the reference oscillator cannot be selected arbitrarily. An example of this is when the radio communication unit in question comprises a system clock generating a clock signal utilized for different forms of timing. It is then desirable—a requirement in some radio communications systems—to be able to use the system clock as a reference oscillator. If the frequency f0 of the clock signal is not divisible by the channel spacing CS the clock signal cannot be used directly as a reference frequency signal to a phase locked loop. The remaining option is to multiply the frequency f0 of the clock signal by means of a frequency multiplier, by a suitable integer K. The frequency multiplier takes up space and also consumes current. Another disadvantage of using the frequency multiplier is the risk that the reference frequency $f_{ref}$ that must be used becomes higher than what the phase locked loop can handle. The circuits currently available in the market, and normally used in mass produced consumer products, can handle reference frequencies up to approximately 30 MHz; there are commercial circuits that can handle frequencies up to approximately 40 MHz, but only a limited selection. This disadvantage becomes especially severe when the radio communication unit in question is to communicate in a number (n) of frequency ranges with associated channel spacings CS1, . . . , CSn, as will become apparent from the following calculation. Let θ(J,L) denote the highest common integer factor of two arbitrary integers J and L. A number (n) of values p1, . . . , pn are now recursively defined, according to:

$$p1 = CS1/\theta(f0, CS1) \tag{3},$$

$$pi \equiv CSi \Big/ \theta\left(f0 \cdot \prod_{k=1}^{i-1} pk, CSi\right) \quad i = 2, \ldots, n. \tag{4}$$

The smallest integer $K_{min}$ by which the frequency multiplier must frequency multiply the clock signal is then given by $$K_{\min} = \prod_{i=1}^{n} pi. \tag{5}$$

A may be seen $K_{min}$ can become relatively large if the frequency f0 of the clock signal is not divisible by most of the channel spacings CS1, . . . , CSn. In many technical systems, also, the prescribed frequency of the clock signal is relatively high (an order of magnitude of 10 MHz is not unusual), which does not improve things.

As a concrete example, a dual-mode radio telephone for use in the AMPS system and the PCS 1900 system will be discussed. The channel spacing in AMPS is 30 kHz and the channel spacing of the PCS 1900 system is 200 kHz. The timing in the PCS 1900 system is based on a clock signal having a frequency of 13 MHz. The equations (3), (4) and (5) give $K_{min}$=3, which implies a reference frequency $f_{ref}$ of 39 MHz. The selection of circuits available in the market that can handle such a high reference frequency is, as mentioned above, relatively limited, and it is therefore desirable not to have to use such a high reference frequency.

According to the present invention it will now be shown how a clock signal from a system clock, having a frequency F0, can be used directly as a reference frequency signal in a frequency synthetization without the need for a frequency multiplier, independently of the relationship between the clock signal frequency f0 and the channel spacings CS1, . . . , CSn. According to the invention it is proposed to use fractional-N PLL technology in the frequency synthetization. According to the above, f0=$f_{ref}$ now applies. It may be seen from Equation 2 that for a certain given channel spacing CSi a sequence of oscillator signals having a mutual frequency difference corresponding to this channel spacing CSi may be obtained using the frequency synthesizer circuit shown in FIG. 2 by selecting the integers Q and R according to the following:

$$QR = f_{ref}/\theta(f_{ref}, CSi) \tag{6}.$$

By increasing or decreasing the integer F by CSi/θ($f_{ref}$, CSi) the output frequency $f_{out}$ from the fractional-N PLL circuit will increase, or decrease, corresponding to the channel spacing CSi. For the fractional-N PLL circuits available today the integer Q may only be selected as five or eight. As a consequence of this the right side of Equation (6) must theoretically contain a factor five or eight to function. In practice, however, this almost always applies. The integers N and F are selected, as will be understood by a person skilled in the art, taking into account the frequency range in which the communication is to take place and the design of the radio communication devices used in the communication.

Referring again to the previous example of a dual-mode radio telephone. To generate oscillator signals according to the invention for use in channel selection in the AMPS system the integers are selected as Q=5 and R=260. Another advantage is that the comparator frequency (50 kHz) is then higher than the channel spacing, which implies less noise and faster adjustment of the oscillator signals. For the channel selection in the PCS 1900 system the integers are selected as Q=5 and R=13, and the comparator frequency therefore becomes 1 MHz. Since the reference frequency 13 MHz is divisible by the channel spacing of the PCS 1900 system of course the integer R may be selected in the same way as with a conventional phase locked loop, that is, R=65 (F=0, Q arbitrary), in which case the comparator frequency becomes equal to the channel spacing (200 kHz).

Figure 3:
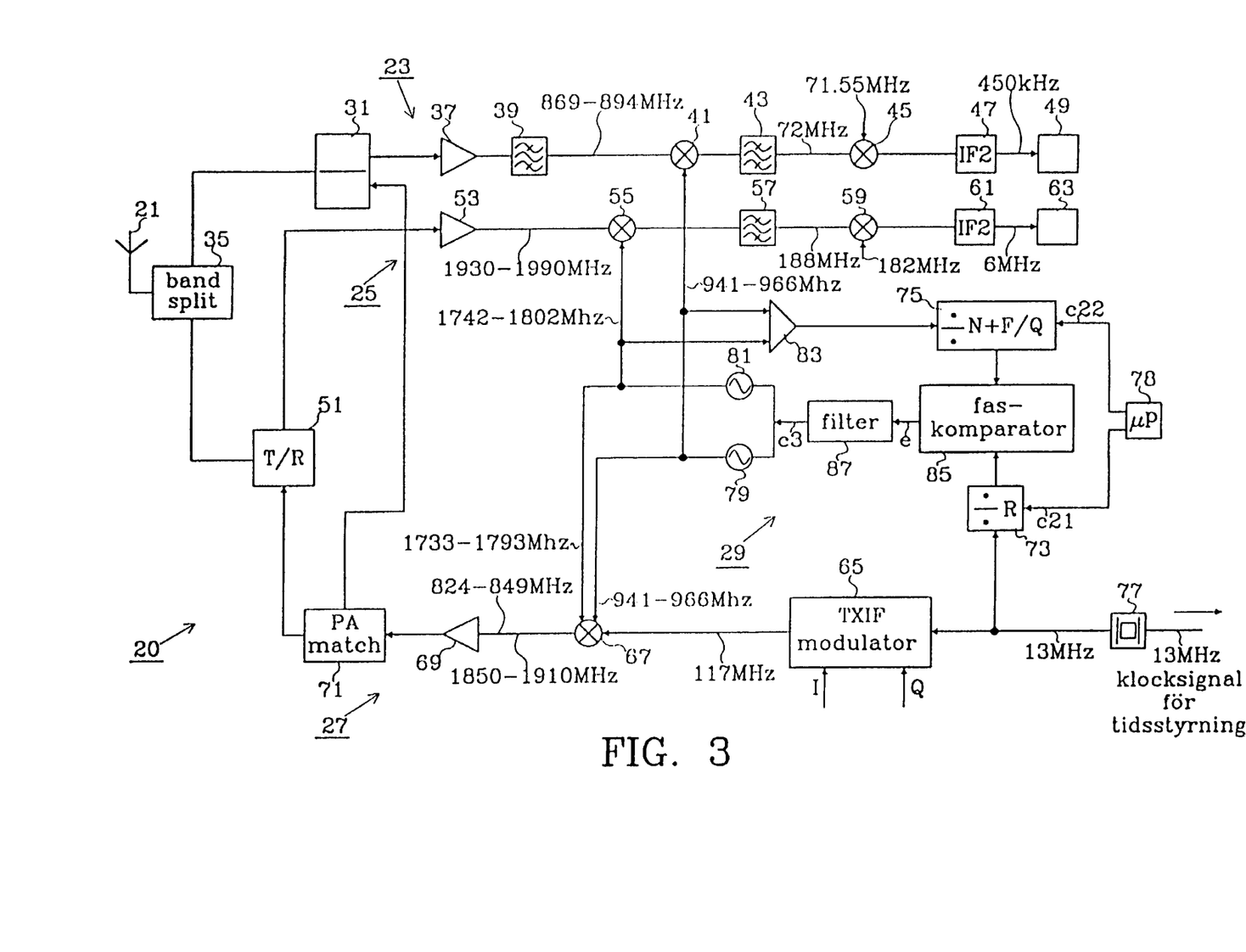
FIG. 3 is a block diagram of a radio communication unit.

FIG. 3 shows a block diagram of an example of a radio communication unit 20 in accordance with the present invention. To make the example more concrete, the radio communication unit 20 in FIG. 3 is intended for use in a dual-mode radio telephone for use in AMPS and PCS1900.

The radio communication unit 20 of FIG. 3 comprises an antenna 21. The radio communication unit 20 also comprises radio communication means connected to the antenna for communication in a first frequency range (824–894 MHz) for AMPS, having a channel spacing of 30 kHz, and a second frequency range (1850–1990 MHz) for the PCS1900 system having a channel spacing of 200 kHz. The radio communication unit 20 therefore comprises a first and a second receiver chain 23 and 25, respectively, for downlink communication in the APMS and PCS1900 systems, respectively. The radio communication unit 20 also comprises a transmitter chain 27 for uplink communication in both systems. A frequency synthesizer circuit 29 is arranged to generate oscillator signals having predetermined frequencies for use in channel selection in the first and the second receiver chain 23, 25 and in the transmitter chain 27.

The first receiver chain 23 is connected to the antenna through a duplex filter 31 and a band split 35 splitting between the AMPS range and the PCS1900 range. The first receiver chain 23 comprises an amplifier 37 connected to the duplex filter 31. The first receiver chain comprises a first bandpass filter 39 connected to the amplifier 37. The band split 35, the duplex filter 31 and the first bandpass filter 39 in the first receiver chain 23 are arranged in such a way that the first receiver chain 23 receives, through the antenna 21, radio frequency signals having frequencies in the range of 869–894 MHz, corresponding to the downlink range for AMPS. The first receiver chain 23 is a superheterodyne receiver chain and therefore comprises a first mixer 41 connected to the first bandpass filter 39 and to a first intermediate frequency stage in the form of a second bandpass filter 43. The second bandpass filter 43 in the first receiver chain 23 has a centre frequency of 72 MHz. The first mixer 41 in the first receiver chain 23 is connected to the frequency synthesizing circuit 29 and is arranged to receive oscillator signals, generated by the frequency synthesizing circuit 29 and having frequencies in the interval of 941–966 MHz. The frequency spacing between these oscillator signals corresponds to the channel spacing in AMPS (30 kHz). The channel selection in the first receiver chain 23 is made by the first mixer 41 in combination with the second bandpass filter 43 in that the first mixer 41 moves the frequency of the channel that is to be received at a given time to 72 MHz, in itself a well known method. The frequency of the oscillator signal received by the first mixer 41 in the first receiver chain 23 at the given time therefore determines the AMPS channel to be selected. The first receiver chain 23 also comprises a second mixer 45 connected to the second bandpass filter 43 and is arranged to receive a first intermediate frequency signal of 72 MHz from the second bandpass filter 43. The second mixer 45 in the first receiver chain 23 is further arranged to receive an oscillator signal—generated by a frequency synthesizing circuit that is not shown— having a frequency of 71.55 MHz, the second mixer 45 being arranged to generate a second intermediate frequency signal of 450 kHz by mixing down the first intermediate frequency signal of 72 MHz. The first receiver chain also comprises a second intermediate frequency stage 47 connected to the second mixer 45 and arranged to receive the second intermediate frequency signal of 450 kHz. The second intermediate frequency stage 47 of the first receiver chain 23 is followed by a detector unit 49.

The second receiver chain 25 is connected to the antenna 21 through a transmit/receive switch 51 and the band split 35. The second receiver chain 25 comprises an amplifier 53 connected to the transmit/receive switch 51. The band separator 35, the transmit/receive switch 51 and the amplifier 53 of the second receiver chain 25 are arranged in such a way that the second receiver chain 25 receives, through the antenna 21, radio frequency signals having frequencies in the range 1930–1990 MHz, corresponding to the downlink range for PCS1900. The second receiver chain 25 comprises a first mixer 55 connected both to the amplifier and to a first intermediate frequency stage in the form of a first bandpass filter 57. The first bandpass filter 57 in the second receiver chain 25 has a centre frequency of 188 MHz. The first mixer 55 in the second receiver chain 25 is also connected to the frequency synthesizing circuit 29, and is arranged to receive oscillator signals, generated by the frequency synthesizing circuit 29 having frequencies in the interval of 1742–1802 MHz. The frequency spacing between these oscillator signals corresponds to the channel spacing of PCS1900 (200 kHz). The channel selection in the second receiver chain 25 is made, in a corresponding way to the first receiver chain 23, by the first mixer 55 in combination with the first bandpass filter 57, and the frequency of the oscillator received by the first mixer 55 at a given time therefore determines which PCS1900 channel is selected. The second receiver chain 25 further comprises a second mixer 59, connected to the first bandpass filter 57 and arranged to receive a first intermediate frequency signal of 188 MHz. The second mixer 59 in the second receiver chain 25 is further arranged to receive an oscillator signal, generated by a frequency synthesizing circuit that is not shown, of 182 MHz, the second mixer 59 being arranged to generate a second intermediate frequency signal of 6 MHz by mixing down the first intermediate frequency signal of 188 MHz. The second receiver chain 25 comprises a second intermediate frequency stage 61 connected to the second mixer 59 and is arranged to receive the second intermediate frequency signal of 6 MHz. The second intermediate frequency stage 61 in the second receiver chain 25 is followed by a detector unit 63.

The transmitter chain 27 is used both for transmission in AMPS (824–849 MHz) and for transmission in PCS1900 (1850–1910 MHz). The transmitter chain 27 is connected to the antenna 21 through the duplex filter 31 and the band split 35 when signals are transmitted in AMPS and through the transmit/receive switch 51 and the band split 35 when signals are transmitted in PCS1900. The reason for this arrangement is, of course, that the radio communication unit 20, when communicating in AMPS, transmits and receives at the same time, whereas in PCS1900 transmission and reception do not occur at the same time. The transmitter chain 27 comprises a transmitter intermediate frequency modulator 65, arranged to generate a modulated transmitter intermediate frequency signal having a transmitter intermediate frequency of 117 MHz. The same transmitter intermediate frequency (117 MHz) is used for both AMPS and PCS1900. The transmitter intermediate frequency modulator 65 is arranged to receive a first and a second quadrature signal I and Q, used for the generation of the modulated intermediate frequency signal of 117 MHz. The transmitter chain 27 comprises a mixer 67 connected to the transmitter intermediate frequency modulator 65 and arranged to receive the modulated transmitter intermediate frequency signal of 117 MHz. The mixer 67 in the transmit chain 27 is also connected to the frequency synthesizer circuit 29 and is arranged to receive oscillator signals, generated by the frequency synthesizer circuit, having frequencies in a first interval 941–966 MHz and a second interval 1733–1802 MHz, although not at the same time. The frequency spacing between the oscillator signals in the first interval corresponds to the channel spacing in AMPS and the frequency spacing between the oscillator signals in the second interval corresponds to the channel spacing in PCS1900. The channel selection in the transmit chain 27 is made by the mixer 67 by mixing up the modulated intermediate frequency signal of 117 MHz to the desired radio frequency channel. The frequency of the oscillator signal received by the mixer in the transmit chain 27 at any given time therefore determines which channel is to be selected, which is in itself a known method. The transmit chain 27 comprises an amplifier 69 connected to the mixer 67. The amplifier 69 in the transmit chain 27 is therefore arranged to receive and amplify signals having frequencies in the range of 824–849

MHz, corresponding to the uplink range in AMPS and signals having frequencies in the range of 1850–1900 MHz, corresponding to the uplink range in PCS1900, but not at the same time. The transmit chain 27 finally comprises a power amplifier adapter 71 connected to the amplifier 69 in the transmit chain 27 and arranged to receive the amplified signals from the amplifier 69. The power amplifier adapter 71 also comprises to the duplex filter 31 and the transmit/receive switch 51, and is arranged with a band split function separating the AMPS range and the PCS1900 range.

The frequency synthesizing circuit 29 of the radio communication unit 20 is based on a fractional-N PLL circuit. Thus, the frequency synthesizer circuit 29 comprises a reference frequency divider 73 and a main frequency divider 75. The radio communication unit 20 further comprises a crystal oscillator 77 used as a system clock. The crystal oscillator 77 is arranged to generate a clock signal of 13 MHz. The clock signal of 13 MHz is used for timing in PCS1900, for example for bit rate and burst rate control. The reference frequency divider 73 is connected to the crystal oscillator 77 and is arranged to receive the clock signal of 13 MHz as a reference frequency signal. The reference frequency divider 73 and the main frequency divider 75 are connected to a control unit 78 and are arranged to receive a first and a second control signal, c21 and c22, respectively, generated by the control unit 78. The transmit intermediate frequency modulator 65 is also connected to the crystal oscillator 77 and is arranged to receive the clock signal of 13 MHz, which is used by the transmit intermediate frequency modulator 65 when generating the transmit intermediate frequency signal of 117 MHz.

The frequency synthesizing circuit 29 further comprises a first and a second voltage controlled oscillator 79 and 81. The first voltage controlled oscillator 79 is connected to the first mixer 41 in the first receiver chain 23 and to the mixer 67 in the transmitter chain 69. The first voltage controlled oscillator is arranged to generate the oscillator signals used in channel selection in AMPS. The second voltage controlled oscillator 81 is connected to the first mixer 55 in the second receiver chain 25 and to the mixer 67 in the transmitter chain 27. The second voltage controlled oscillator 81 is arranged to generate the oscillator signals used in channel selection in PCS1900. The two voltage controlled oscillators 79 and 81 are also connected to the main frequency divider 75 through a combiner 83. The radio communication unit 20 shown in FIG. 3, as mentioned above, does not use AMPS and PCS1900 at the same time, which means that the two voltage controlled oscillators 79 and 81 are not operating at the same time. The reason for the frequency synthesizing circuit 29 comprising two voltage controlled oscillators 79 and 81 and not just one oscillator is that it is not possible to design an oscillator that can generate oscillator signals in the large frequency range used here. The frequency synthesizing circuit 29 comprises a phase comparator 85 connected to the reference frequency divider 73 and the main frequency divider 75. The frequency synthesizer circuit 29 comprises a loop filter 87 connected to the phase comparator 85 and arranged to receive a phase difference signal e from the phase comparator 85. The loop filter 87 is arranged to generate a third control signal c3, in dependence of the phase difference signal e, for controlling the two voltage controlled oscillators 79 and 81, that are connected to the loop filter and arranged to receive the third control signal c3.

The frequency synthesizing circuit 29 in the radio communication unit 20, as will be understood from the discussion in connection with FIG. 2, can generate oscillator signals of frequencies $f_{out}$ according to $$f_{out} = \frac{N + F/Q}{R} 13\,\text{MHz}.$$

Here, like above, N, F, Q and R are integers, determined by the first and the second control signal c21 and c22. Below, in two tables, it is shown how the integers N, F, Q and R can be selected in uplink and downlink channel selection in AMPS and PCS1900.

TABLE 1

UNIT: [MHz]

AMPS

Comparator Frequency = 50 kHz    R = 260

| Channel no. | FTX | FRX | fout | N | F | Q |
|---|---|---|---|---|---|---|
| 991 | 824.04 | 869.04 | 941.04 | 18820 | 4 | 5 |
| 992 | 824.07 | 869.07 | 941.07 | 18821 | 2 | 5 |
| 993 | 824.10 | 869.10 | 941.10 | 18822 | 0 | 5 |
| 994 | 824.13 | 869.13 | 941.13 | 18822 | 3 | 5 |
| 995 | 824.16 | 869.16 | 941.16 | 18823 | 1 | 5 |
| 996 | 824.19 | 869.19 | 941.19 | 18823 | 4 | 5 |
| 997 | 824.22 | 869.22 | 941.22 | 18824 | 2 | 5 |
| 998 | 824.25 | 869.25 | 941.25 | 18825 | 0 | 5 |
| 999 | 824.28 | 869.28 | 941.28 | 18825 | 3 | 5 |
| 1000 | 824.31 | 869.31 | 941.31 | 18826 | 1 | 5 |
| 1001 | 824.34 | 869.34 | 941.34 | 18826 | 4 | 5 |
| etc. | etc. | etc. | etc. | etc. | etc. | etc. |
| 1023 | 825.00 | 870.00 | 942.00 | 18840 | 0 | 5 |
| 1 | 825.03 | 870.03 | 942.03 | 18840 | 3 | 5 |
| 2 | 825.06 | 870.06 | 942.06 | 18841 | 1 | 5 |
| 3 | 825.09 | 870.09 | 942.09 | 18841 | 4 | 5 |
| 4 | 825.12 | 870.12 | 942.12 | 18842 | 2 | 5 |
| 5 | 825.15 | 870.15 | 942.15 | 18843 | 0 | 5 |
| 6 | 825.18 | 870.18 | 942.18 | 18843 | 3 | 5 |
| etc. | etc. | etc. | etc. | etc. | etc. | etc. |
| 799 | 848.97 | 893.97 | 965.97 | 19319 | 2 | 5 |

TABLE 2

UNIT: [MHz]

PCS1900

Comparator Frequency = 1 MHz    R = 13

| Channel no. | FTX | FRX | fout (TX) | fout (RX) | N(TX) | N(RX) | F | Q |
|---|---|---|---|---|---|---|---|---|
| 512 | 1850.2 | 1930.2 | 1733.2 | 1742.2 | 1733 | 1742 | 1 | 5 |
| 513 | 1850.4 | 1930.4 | 1733.4 | 1742.4 | 1733 | 1742 | 2 | 5 |
| 514 | 1850.6 | 1930.6 | 1733.6 | 1742.6 | 1733 | 1742 | 3 | 5 |
| 515 | 1850.8 | 1930.8 | 1733.8 | 1742.8 | 1733 | 1742 | 4 | 5 |
| 516 | 1851 | 1931 | 1734 | 1743 | 1734 | 1743 | 0 | 5 |
| 517 | 1851.2 | 1931.2 | 1734.2 | 1743.2 | 1734 | 1743 | 1 | 5 |

TABLE 2-continued

UNIT: [MHz]

PCS1900

Comparator Frequency = 1 MHz    R = 13

| Channel no. | FTX | FRX | fout (TX) | fout (RX) | N(TX) | N(RX) | F | Q |
|---|---|---|---|---|---|---|---|---|
| 518 | 1851.4 | 1931.4 | 1734.4 | 1743.4 | 1734 | 1743 | 2 | 5 |
| 519 | 1851.6 | 1931.6 | 1734.6 | 1743.6 | 1734 | 1743 | 3 | 5 |
| 520 | 1851.8 | 1931.8 | 1734.8 | 1743.8 | 1734 | 1743 | 4 | 5 |
| 521 | 1852 | 1932 | 1735 | 1744 | 1735 | 1744 | 0 | 5 |
| etc. | etc. | etc. | etc. | etc. | etc. | etc. | etc. | etc. |
| 809 | 1909.6 | 1989.6 | 1792.6 | 1801.6 | 1792 | 1801 | 3 | 5 |
| 810 | 1909.8 | 1989.8 | 1792.8 | 1801.8 | 1792 | 1801 | 4 | 5 |

FTX denotes the centre frequency of the channels at transmission and FRX denotes the centre frequency of the channels at reception. In the table for AMPS the integers N and F are related to the desired output frequencies $f_{out}$ (in Herz) according to the following:

$$N=\text{int}(f_{out}/(5 \cdot 10^4)) \quad (7),$$

$$F=\text{fract}(f_{out}/(5 \cdot 10^4)) \cdot 5 \quad (8),$$

where int(x) denotes the integer part and fract(x) denotes the decimal part of a number x.

In the table for PCS the integers N and F are related to the desired output frequencies $f_{out}$ (in Herz) according to the following:

$$N=\text{int}(f_{out}/10^6) \quad (9),$$

$$F=\text{fract}(f_{out}/10^6) \cdot 5 \quad (10)$$

The present invention, of course, is not limited to use in mobile telephony but may also be used for other applications, for example in satellite communication systems.

Figure 4:
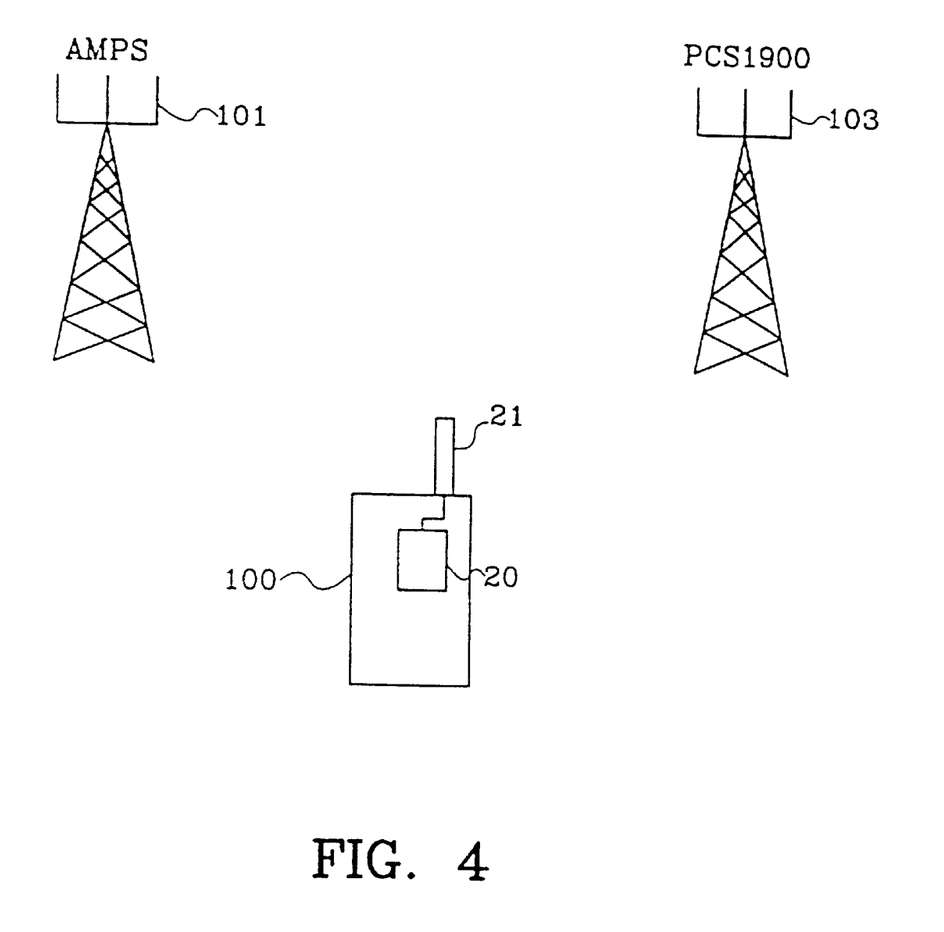
FIG. 4 is a view of a radio telephone for communication in the AMPS system and the PCS 1900 system.

FIG. 4 shows a radio telephone 100 comprising the radio communication unit 20 shown in FIG. 3, with the antenna 21. In FIG. 4 it is illustrated how the radio telephone 100, using the radio communication unit 20, can communicate either in AMPS through a first base station 101 or in PCS1900 through a second base station 103.

What is claimed is:

1. A radio communication unit comprising:
   at least one antenna;
   radio communication means connected to the antenna and arranged for communication in at least one frequency range having at least one associated channel spacing, said radio communication means in turn comprising channel selection means, said channel selection means being arranged to use oscillator signals of predetermined frequencies in the channel selection;
   at least one system clock arranged to generate at least one clock signal having a predetermined clock frequency for timing the radio communication unit, wherein the clock frequency is not divisible by all the channel spacings; and
   a frequency synthesizing circuit in the form of a fractional-N PLL circuit connected to the radio communication means and having at least one controllable oscillator for generating said oscillator signals, said fractional-N PLL circuit being further provided with a component which is connected to the system clock and is disposed to receive said clock signal of said predetermined clock frequency as a reference frequency signal.

2. The radio communication unit according to claim 1, wherein:
   said component is disposed to receive a selected control signal, and to divide said predetermined frequency of said received clock signal in accordance with said control signal.

3. The radio communication unit according to claim 2, wherein the radio communication means comprises at least one receiver chain connected to the antenna and arranged for the reception of radio signals in at least one of the frequency ranges, and wherein the at least one chain includes a superheterodyne receiver chain comprising a first mixer and a first intermediate frequency stage connected to the first mixer, said first mixer being connected to the frequency synthesizing circuit and arranged to receive a predetermined number of the oscillator signals for use in channel selection.

4. The radio communication unit according to claim 1, wherein the radio communication means comprises at least one transmitter chain connected to the antenna and arranged for the transmission of radio signals in at least one of the frequency ranges.

5. The radio communication unit according to claim 4, wherein the at least one transmitter chain comprises:
   a transmit intermediate frequency modulator, arranged to generate a modulated transmit intermediate frequency signal; and
   a mixer connected to the transmit intermediate frequency modulator and arranged to mix up the transmit intermediate frequency signal to channels in at least one of the frequency ranges, the mixer being connected to the frequency synthesizer circuit and arranged to receive a predetermined number of the oscillator signals for use in the mixing.

6. The radio communication unit according to claim 5, wherein the transmit intermediate frequency modulator is connected to the system clock and arranged to receive the clock signal for use in the generation of the transmit intermediate frequency signal.

7. A radio telephone arranged for communication in at least one mobile telephony system, the radio telephone comprising a radio communication unit having:
   at least one antenna;
   radio communication means connected to the antenna and arranged for communication in at least one frequency range having at least one associated channel spacing, said radio communication means in turn comprising channel selection means, said channel selection means being arranged to use oscillator signals of predetermined frequencies in the channel selection;

at least one system clock arranged to generate at least one clock signal having a predetermined clock frequency for the timing of the radio communication unit, wherein the clock frequency is not divisible by all the channel spacings; and a frequency synthesizing circuit in the form of a fractional-N PLL circuit connected to the radio communication means and having at least one controllable oscillator for generating said oscillator signals, said fractional-N PLL circuit being further provided with a component connected to the system clock and disposed to receive said clock signal of said predetermined clock frequency as a reference frequency signal.

8. The radio telephone according to claim 7, wherein the radio communication unit is arranged for use in at least AMPS and PCS1900.

9. A method for communicating in a specified number of frequency ranges, each having an associated channel spacing and a plurality of channels, the method comprising the steps of:

generating a clock signal of a predetermined frequency that is not divisible by all of the channel spacings;

coupling said clock signal to a frequency synthesizer circuit having a controllable oscillator corresponding to each of said frequency ranges;

operating said frequency synthesizer circuit to generate an oscillator signal corresponding to the channel spacing associated with a given one of said frequency ranges, and having a frequency equal to said predetermined frequency of said clock signal multiplied by a factor equal to (N+F/Q)/R, wherein N, F, Q and R respectively comprise freely selectable integers, except that the quantity (N+F/Q) comprises a rational number, and the quantity (QR) is equal to said clock signal frequency divided by a specified function of said clock signal frequency and the channel spacing of said given frequency range; and using said oscillator signal to select one of the plurality of channels of said given frequency range.

10. The method according to claim 9, wherein the step of generating an oscillator signal using the frequency synthesizer circuit further comprises using a fractional-N PLL circuit that is arranged to utilize the clock signal as a reference frequency signal.

11. The method according to claim 10, wherein said step of generating said oscillator signal further comprises using the fractional-N PLL circuit to control the controllable oscillator corresponding to said given frequency range.

12. The method according to claim 9, further comprising transmitting data over the selected channel.

13. The method according to claim 12, wherein the step of transmitting data further includes transmitting radio telephone data arranged for communication in at least AMPS and PCS1900.

14. The method according to claim 12, wherein the step of transmitting data further includes transmitting radio communication data in a mobile telephony system.

15. The method according to claim 12, wherein the step of transmitting data further includes transmitting radio communication data in a satellite communication system.

16. A radio communication unit comprising:

at least one antenna;

radio communication means connected to the antenna and arranged for communication in a plurality of frequency ranges, each having an associated channel spacing and a plurality of channels, said radio communication means comprising channel selection means arranged to use a plurality of oscillator signals of predetermined frequencies in the channel selection;

a system clock arranged to generate a clock signal having a predetermined clock frequency for timing the radio communication unit, wherein the clock frequency is not divisible by all the channel spacings;

a fractional-N PLL circuit connected to the radio communication means and disposed to provide a PLL circuit output signal, said PLL circuit comprising a main frequency divider, a reference frequency divider coupled to receive said clock signal of said predetermined frequency, and at least one controllable oscillator; and said main and reference frequency dividers are responsive to respective control signals to divide said clock signal frequency, and to cooperatively adjust said PLL circuit output signal to the predetermined frequency of any selected one of said oscillator signals.

17. The radio communication unit of claim 16, wherein:

said PLL circuit is disposed to generate a given oscillator signal corresponding to the channel spacing associated with a given one of said frequency ranges, said given oscillator signal having a frequency equal to said predetermined frequency of said clock signal multiplied by a factor equal to (N+F/Q)R, wherein N, F, Q and R respectively comprise freely selectable integers, except that the quantity (N+F/Q) comprises a rational number, and the quantity (QR) is equal to said clock signal frequency divided by a specified function of said clock signal frequency and the channel spacing of said given frequency range; and N, F and Q are associated with said main frequency divider and R is associated with said reference frequency divider.

18. The radio communication unit of claim 16 wherein:

said fractional-N PLL circuit comprises a plurality of controllable oscillators.

19. The radio communication unit of claim 16 wherein:

said radio communication means comprises at least one receiver chain connected to the antenna and arranged for the reception of radio signals in at least one of the frequency ranges, and wherein the at least one chain includes a superheterodyne receiver chain comprising a first mixer and a first intermediate frequency stage connected to the first mixer, said first mixer being connected to the fractional-N PLL circuit and arranged to receive a predetermined number of the oscillator signals for use in channel selection.

20. The radio communication unit of claim 16 wherein:

said radio communication means comprises at least one transmitter chain connected to said antenna and arranged for the transmission of radio signals in at least one of the frequency ranges.

21. The radio communication unit of claim 20 wherein said at least one transmitter chain comprises:

a transmit intermediate frequency modulator, arranged to generate a modulated transmit intermediate frequency signal; and a mixer connected to the transmit intermediate frequency modulator and arranged to mix up the transmit intermediate frequency signal to channels in at least one of the frequency ranges, the mixer being connected to the fractional-N PLL circuit and arranged to receive a predetermined number of the oscillator signals for use in the mixing.

22. The radio communication unit of claim 21 wherein:

said transmit intermediate frequency modulator is connected to said system clock and arranged to receive said clock signal for use in the generation of said intermediate frequency signal.

23. The radio communication unit of claim 16 wherein:

said radio communication unit is incorporated into a radio telephone unit arranged for use in at least AMPS and PCS1900.

* * * * *

UNITED STATES PATENT AND TRADEMARK OFFICE
CERTIFICATE OF CORRECTION

PATENT NO. : 6,370,360 B1
DATED : April 9, 2002
INVENTOR(S) : Lars P. Künkel

It is certified that error appears in the above-identified patent and that said Letters Patent is hereby corrected as shown below:

<u>Title page,</u>
Item [54], Title, replace "ARRANGEMENT AND METHOD FOR RADIO COMMUNICATION" with -- MULTIPLE MODE RADIO WITH FRACTIONAL-N FREQUENCY SYNTHESIZER --

Item [73], Assignee, replace "Telefonaktiebolaget LM Ericsson (SE)" with -- Telefonaktiebolaget LM Ericsson (publ), Stockholm (SE) --

Signed and Sealed this

Twenty-fifth Day of May, 2004

JON W. DUDAS
*Acting Director of the United States Patent and Trademark Office*